United States Patent [19]
Koehler et al.

[11] Patent Number: 5,212,453
[45] Date of Patent: May 18, 1993

[54] PULSE ECHO METHOD AND APPARATUS FOR MEASURING THE MOISTURE CONTENT OF MATERIALS

[75] Inventors: Kurt Koehler, Ettlingen; Robin Fundinger, Karlsbad, both of Fed. Rep. of Germany

[73] Assignee: IMKO Micromodultechnik GmbH, Ettlingen, Fed. Rep. of Germany

[21] Appl. No.: 739,226

[22] Filed: Aug. 1, 1991

[30] Foreign Application Priority Data

Aug. 3, 1990 [DE] Fed. Rep. of Germany ....... 4024648

[51] Int. Cl.$^5$ .................... G01R 27/02; G01R 31/11
[52] U.S. Cl. .................... 324/664; 324/533; 324/676; 340/604
[58] Field of Search ............ 324/525, 532, 533, 534, 324/535, 664, 663, 694, 710, 643, 676; 340/604

[56] References Cited

U.S. PATENT DOCUMENTS

| | | | |
|---|---|---|---|
| 3,766,471 | 10/1973 | Pullman | 324/694 |
| 4,104,582 | 8/1978 | Lambertsen | 324/533 |
| 4,484,131 | 11/1984 | Jenkinson | 324/533 |
| 4,949,076 | 8/1990 | Wann | 324/533 X |

Primary Examiner—Gerard R. Strecker
Assistant Examiner—Diep Do
Attorney, Agent, or Firm—Klaus J. Bach

[57] ABSTRACT

In an apparatus for determining the moisture content of a material by measuring the dielectric constant of the material by means of a measuring conductor which is disposed such that the material becomes a dielectric for the measuring conductor and wherein the time lapse between the application of an electrical signal to the measuring conductor and the return of the echo of the signal is employed as an indication of the dielectric constant and consequently the moisture content of the material, the electrical signal is a pulsed signal with a pulse duration which is greater than the time lapse between signal start and return of the echo of the signal start and an independent oscillator is provided whose cycles are counted during the opening state of a gate circuit which is open between the application of electrical signal to the measuring conductor and the return of the echo thereof, the counted cycles thereby providing an indication for the time lapsed from signal start to echo return in a simple manner with simple, inexpensive components.

17 Claims, 3 Drawing Sheets

PULSE ECHO METHOD AND APPARATUS FOR MEASURING THE MOISTURE CONTENT OF MATERIALS

BACKGROUND OF THE INVENTION

1. Field of the Invention

The invention relates to a method and apparatus for determining the moisture content of materials such as particulate materials, soils or solid materials such as concrete.

2. Description of the Prior Art

Doerr-weighing method

A classical method for determining moisture content resides in determining the weight of a sample before and after drying and, for many goods, this is standard procedure for individual evaluations. Automation, however, requires continuously operating measuring procedures which do not incur any substantial delays. The need for taking samples is also a disadvantage of this method.

Calcium carbide method

A large number of chemical moisture content determination methods are available. In one well-known method of this type, a sample, for example of sand, is mixed with calcium carbide in a pressurizable vessel. The pressure resulting from the formation of acetylene is then used as a measure for the moisture content of the sand. It is pointed out, however, that this method is neither continuous nor is it particularly simple and inexpensive and it also requires sample taking.

Karl-Fischer method

This method which utilizes an iodometric reaction is the most common of the chemical moisture content determination methods. It permits determination of trace contents of only 0.1 mg in the solvent extract of a sample. In situ utilization of this method however is not possible.

Electric conductivity measuring method

Measuring the moisture content by determination of the electric conductivity of a material is generally the preferred method since it is inexpensive and requires only simple apparatus and since it is continuous and practically free of delays. The measuring range with conductivity measurement corresponds to the hygroscopic range of the materials which are non-conductive in a dry state. For very dry materials the conductivity determination is not appropriate because of the high resistance and for very wet materials this method is not suitable because of large electrolyte influences.

Neutron measurements

Neutron radiation is greatly slowed by light water atoms whereas it can penetrate most heavy elements with relative ease. If directed through a material, part of the fast neutron, radiation is scattered and slowed down depending on the water content or rather the hydrogen content of the material. A counter tube or a scintillation counter determines a representative portion of the slow neutrons so produced and forms a measure for the moisture content of the material based on a certain volume, utilizing an impulse rate with a time constant of about 1 minute. It is considered to be particularly advantageous that with this method the measured value is integrated for a large volume of material, that is, a good average value is obtained based on a large volume of material. However the method cannot be used if the materials have varying hydrogen contents bound in compounds. It is particularly disadvantageous that a neutron radiation generator has to be utilized.

Dielectric measurement

In contrast to the method utilizing electric conductivity, this method can also be used for liquids, for very dry and very wet materials. It detects also moisture which is enclosed in insulated areas and it averages the water content in contrast to the electric conductivity measurement which, during measurement over a wide track, will consider mainly wet pockets. With an appropriate measuring capacity, dielectric measurements permit measuring far into the wet area, that is, materials with very high moisture content.

Since the present invention relates to a type of dielectric measuring method this state of the art will now be considered in greater detail.

In principle there is a monotonic clear connection between the dielectric constant $\epsilon$ of a medium and its moisture content. The problem of measuring the moisture content is therefore reduced to the problem of measuring the dielectric constant $\epsilon$. In the area of concern two main methods have been developed:

i. Condenser Method:

Two plates are provided in a predetermined spatial arrangement with the material to be measured disposed between the plates, and the dielectric constant $\epsilon$ is determined by way of the capacity of the arrangement. However, with this arrangement, measuring problems are encountered and the size of the condenser plates may become prohibitively large.

ii. Echo Method:

Here a conductor is provided in a long open-ended geometric arrangement. The conductor is electrically connected so that a short pulse can be applied of a duration which is shorter than the time required for the return of the echo from the end of the conductor. If the conductor is in the form of two parallel rods which are inserted into the material to be measured, the dielectric constant can be determined from the travel time of the echo and the moisture content can be determined from the dielectric constant. This method however has encountered problems because of the short time lag between signal application and echo return (ca−10 ns). The excitation pulses should therefore be substantially shorter. In order to permit division of the time between pulse application and return of the echo into a reasonable number of time increments, the pulse duration should be in the area of 1/100 ns. Apparatus known in the art sense the voltage at the beginning of the conductor as a transient (partial sampling method) and analyze the voltage curve manually or automatically. This however requires a substantial amount of equipment particularly because of the needed short duration and accurate repeatability of the signals and their periodic follow-ups required for the recording procedure.

It is the object of the present invention to provide a material moisture content sensing apparatus which is relatively inexpensive through utilization of readily available electronic circuit elements but which nevertheless offers high measurement accuracy and automatic material moisture determination and which does not require correction adjustment during use.

SUMMARY OF THE INVENTION

A method and apparatus for determining the moisture content of a material by measuring the dielectric constant of the material wherein a measuring conductor is disposed closely adjacent the material such that the material becomes a dielectric for the measuring conductor and wherein the time lapse between the application of an electrical signal to the measuring conductor and the return of the echo of the signal is an indication of the dielectric constant and consequently of the moisture content of the material which utilizes a pulsed signal with a pulse duration which is greater than the time lapse between signal start and return of the echo of the signal start. Also an independent oscillator is provided whose cycles are counted during the opening state of a gate circuit connected to be open between the application of the electrical signal to the measuring conductor and the return of the echo thereof thereby providing a count indication of the time lapsed from signal start to echo return in a simple manner.

No complicated circuitry is required for this arrangement as the electrical pulse signal for the measuring conductor does not need to be excessively short. Oscillators which are utilized for the time count are inexpensive and reliable and any desired accuracy can be obtained by counting frequently and utilizing the average count.

Readily available and reliable electronic elements are utilized which provide for an apparatus that is relatively inexpensive and problem free. The method can be utilized for measuring the moisture of loose particulate materials and natural soils but also of solid materials such as concrete. It may further be utilized for large surface areas, for example, for ecological soil examinations. In this connection the apparatus is particularly advantageous because it is relatively inexpensive, the measuring results are easily usable and no apparatus readjustment is necessary. Also no samples need to be taken.

DESCRIPTION OF THE PREFERRED EMBODIMENTS

Figure 1:
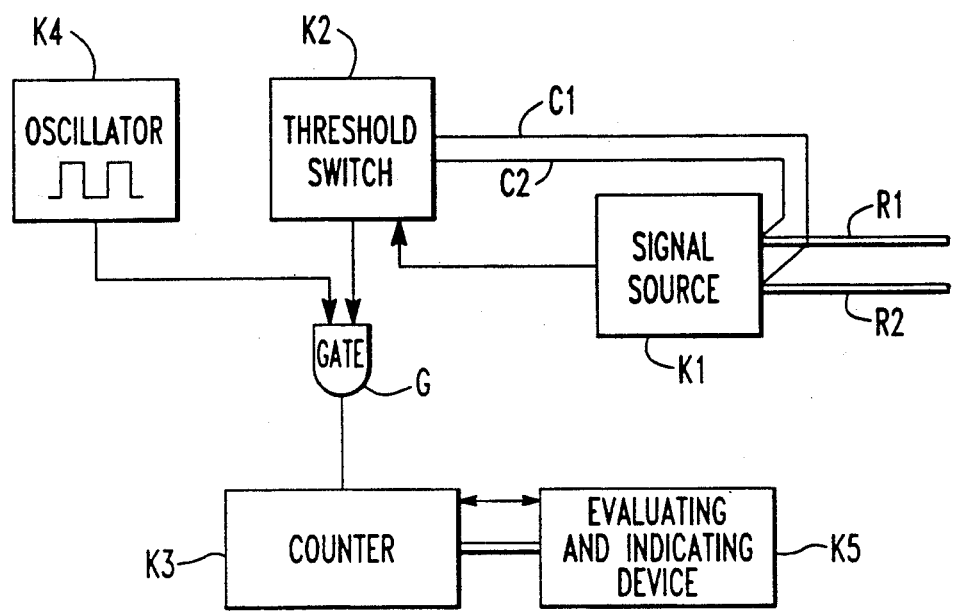
FIG. 1 shows the measuring arrangement according to the invention.

As shown in FIG. 1 there are provided parallel spaced measuring conductors or rods R1 and R2 which are connected at their ends to a signal source K1 adapted to provide a voltage signal with as steep a ramp as possible. The connecting cable between the signal source K1 and the measuring rods R1 and R2 is of negligible length. The internal resistance of the signal source corresponds to the wave resistance of the measuring conductors or rods R1 and R2 as far as it can be reproduced with simple means for the middle of the measuring range. Then few disturbing reflections will occur at the connection between the exit of the signal source K1 and the measuring rods R1 and R2 in a suitable measuring range. However total reflection will occur at the free ends of the measuring rods R1 and R2.

The echo (the reflected signal) reaches the beginning of the measuring rods after a time tx which depends on the physical data of the measuring rods as influenced by the moisture content of the dielectric material surrounding the rods R1 and R2. A threshold switch K2 is connected to the ends of the measuring rods R1 and R2 by short conductors C1 and C2 to compare the voltage at the connector ends of the measuring rods R1 and R2 with predetermined values and provides a gate signal to a counter K3 via a gate circuit G such that the counter counts the impulses supplied to the counter by an associated oscillator K4 only during the time period between the beginning of the energization of the measuring rods and the return of the echo. The counter K3 is connected to an evaluation and indicating device K5 to determine and indicate the counts taken during the travel signal applied to the measuring rods and the return of the echo. The beginning of the gate opening can preferably be initiated by the signal source K1 in a delayed manner such that the gate is opened only after reflections generated at the connected ends of the rods R1 and R2 have passed.

Changes in the moisture content of the material being measured result in changes of the dielectric constant $\epsilon$ of the material and consequently in the capacity of the material surrounding the measuring rods. Since the geometric data of the measuring rods remain unchanged, the travel time tx of the echo depends only on the moisture content of the material surrounding the measuring rods. The relationship can be given by way of an equation or a calibration curve.

Figure 2:
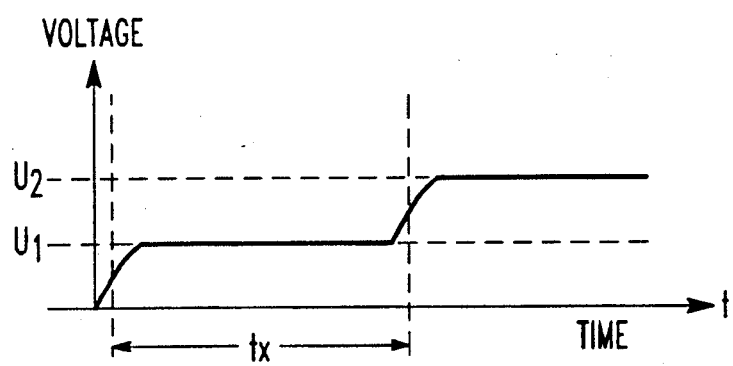
FIG. 2 shows the use of pulse-type excitation signals in accordance with the invention.

Following is a description concerning the measurement of tx as an essential part of the apparatus:

An improvement made possible by the present invention as compared to prior art arrangements resides in the utilization of energizing impulse signals which do not need to be shorter in duration than the travel time for the echo. At the entrance (connecting end) of the measuring conductors or rods, energizing impulse signals and echo are superimposed, thereby providing a total voltage signal as shown in FIG. 2.

Energization starts first with an increase of the voltage from a base value (shown to be zero in FIG. 2) to U1. U1 develops from the idle voltage of the signal source and the division ratio obtained from the timing of conductors or rods R1 (internal resistance of the signal source) and the wave resistance. Upon return of the echo, the voltage is raised to U2. The increase U2−U1 is determined by the reflection factor of the measuring conductors or rods. Afterwards the transient occurrences in the rods reside. At the same time the wave resistance no longer places a load on the signal source and the signal source will then return to its idle voltage.

The advantage of utilizing an energizing signal of relatively long duration, that is, wherein the front and end ramps based on tx are separated by a relatively long time period, resides in the fact that such signals can be generated by inexpensive and reliable electronic equipment.

It is possible to utilize a final stage which, for generating a steep ramp, is driven into saturation but which results in storage times that make it difficult to obtain pulse durations of less than the time tx. In the arrangement described herein the storage time has no detrimental effects, mass produced switching elements can be utilized. Of course the need remains to determine the time tx with an accuracy of 10 ps. In order to make this possible with simple electronic components operating automatically, the present invention utilizes statistical methods as will be described below:

There is provided a suitable circuit in the threshold switching device K2, which, during the travel time of the echo tx, provides a gate signal whose beginning is derived from the signal source and whose end is determined by a threshold switch circuit which recognizes the arrival of the echo by the voltage increase over a threshold value between U1 and U2. Also provided is an oscillator which operates independently and whose periodic time is so adjusted that only few of its periods fall into the time tx. It provides for the measuring rhythm.

Figure 3:
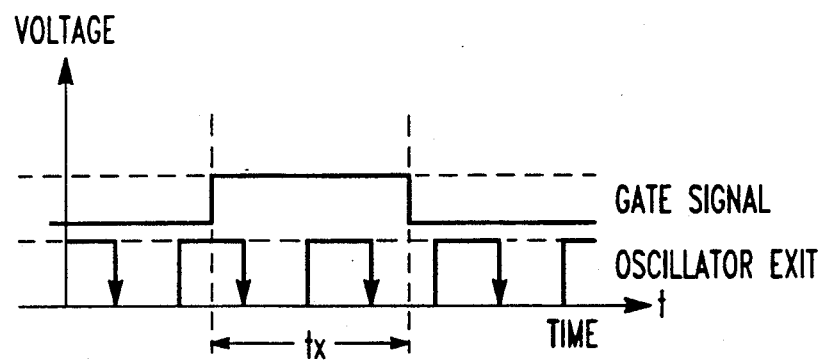
FIGS. 3 and 4 show the determination of time by signal counting under two different conditions.

During the time tx the oscillator output is supplied to a counter by way of the gate circuit such that the counter counts the negative ramp voltages of the oscillator. (It is also possible to count the positive ramp voltages or both.) FIG. 3 shows an example having an echo travel duration tx of 1.5 times the periodic time of the oscillator and wherein the time relationship between gate signal and oscillator signal results in the counting of two negative ramps of the oscillator signal.

Figure 4:
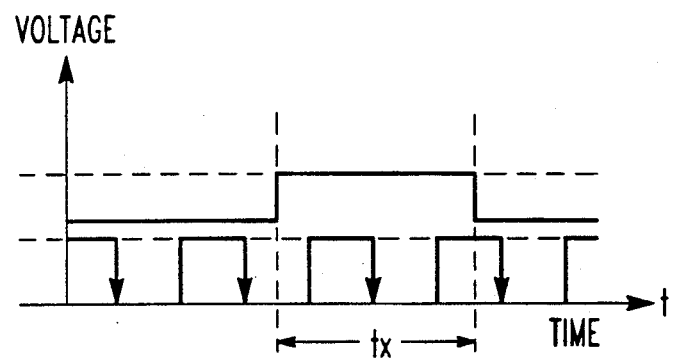

FIG. 4 shows the same example in another time relationship between gate signal and oscillator signal which results in the counting of only one negative ramp. Since there is not particular connection between the oscillator phase and the measuring step, all intermediate possibilities may occur with the same probability. Therefore the probability that two negative ramps of the oscillator signals are counted within the time period tx (as in FIG. 3) in the given case is 0.5. The probability that only one negative ramp is counted (as in FIG. 4) is also 0.5. Since in the given example both incidents happen equally often, on the average 1.5 negative ramps are counted during gate opening. If the negative ramps are counted, for example, during 1000 gate openings, essentially 1500 negative ramps will be counted during a time period of 1000 tx--with small variations.

Generally the numerical count increases proportionally with an increasing tx. If the measuring is repeated sufficiently often, the count, that is, the time tx, can be determined with sufficient accuracy, that is, the time tx can be determined with a resolution of 10 ps. The reliability range for these measurements is determined by the laws of statistics applied with the earlier considerations and variations in the functioning of the gating and counting circuits as long as they have normal distributions and are not the result of drifts or variations experienced over a time period longer than that used for the sampling of the measurements.

As a result the oscillators do not need to be very accurate, their frequency needs to be constant only on the average and the delay times of the logic switching elements need to be constant or to be compensated for only on an average basis but freedom of jitter, freedom of static or the handling of frequencies over 500 MHz do not have to be taken into consideration. The arrangement according to the invention also facilitates its use in connection with premanufactured customer circuits (ASIC) which increases reproducibility and rapid availability. Also, costs are relatively low as a result.

Averaging of the measuring results is done by summation of the counts in a counter chain. However various embodiments are possible and are described below:

Various embodiments:

In one embodiment the sensors (rods) are connected to a computer which stores the counts and provides the counts when required and which is capable of calculating and displaying the moisture content of the material. Also a plurality of sensor arrangements may be connected to a single computer.

It is also advantageous if, in accordance with one embodiment, the counter is read as often as possible before the needed amount of gate openings has been reached and the summation to a value which permits determination of the measurements with sufficient resolution or accuracy is performed in another device such as a computer. If, for example, 1000 gate openings are needed and if, for example, after each 20th opening an interim value is determined and stored, the final count is obtained by the summation of only 50 discrete values. But such a procedure does not only provide for fast results, it also provides for an indication of the deviations of the single values and a statistic evaluation of the measurement. Estimation of reliability and considerations regarding mistakes or deviations with negative influence on the measurements are also possible.

Further embodiments relate to the form of the measuring conductors. They may be parallel rods for soil or particulate materials but for materials which can or should only be contacted on the surface such as concrete plates or compounds whose surfaces must not be damaged, parallel conductors may be placed on the material surfaces. For the determination of the moisture content it has then to be taken into consideration that there is a dielectric structure which is divided in the plane of the conductors and half of which consists of air. Such an embodiment facilitates the use of the apparatus in the construction field and for lumber.

Figure 5:
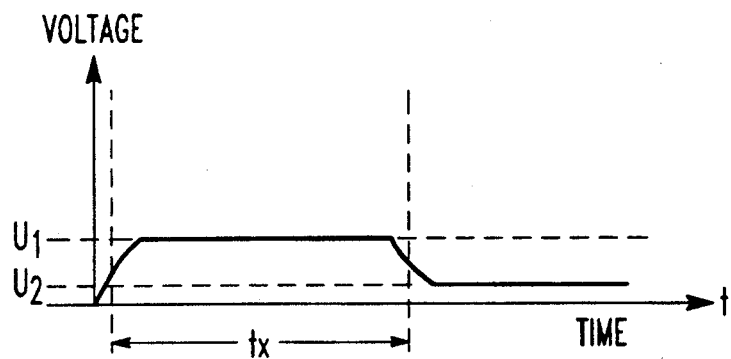
FIG. 5 shows the voltage at the entrance of measuring conductors disposed in a closed circuit.

In a further embodiment the measuring conductor is not open but closed at the free end thereof. With this arrangement, the polarity of the echo is reversed. The voltage at the entrance of the conductor is then as shown in FIG. 5. It provides for certain advantages in the determination of the travel time tx. A circuit K2 consisting of a threshold switch with a threshold of between U1 and U2 can easily provide the gate signal for the counters in this arrangement. Determination of the starting point for the gate opening from the signal source is not necessary but it may still be advantageous in order to achieve independence from effects occurring shortly after energization.

Further the measuring conductors may consist of a plurality of interconnected independent conductors arranged such that an electromagnetic wave proceeds in the sample in a predetermined desired manner. It is also advantageous if one conductor at least partially surrounds the other or others to provide a shield for external fields.

Figure 6:
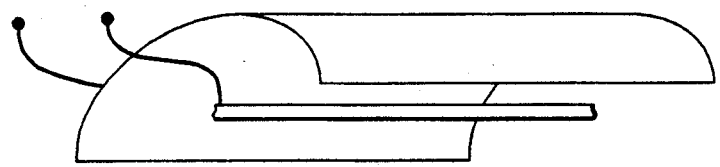
FIG. 6 shows a measurement conductor arrangement wherein one conductor overlays the other to provide shielding.

Especially during material moisture content measurements of solid materials when parallel measuring conductor pairs are placed onto the material, the dielectric constant of the open half space is not defined. If, for example, at the same time a hand is placed on top of the conductors, the measurement results become unusable. An arrangement as shown in FIG. 6 where one of the conductors covers the other is helpful in such a case.

The arrangement corresponds to a coaxial conductor structure which is divided along its central axis. The central conductor and the longitudinal edges of the outer conductor define a plane for disposition on the material to be measured. The space between the inner and the outer conductors provides for a dielectric with predetermined properties; it may be air or a solid material. The outer conductor may also serve as a grip sleeve. Also with this arrangement the conductor may be open or closed at its end. Experience indicates that in this case there is no linear connection between tx and the material moisture content.

Figure 7:
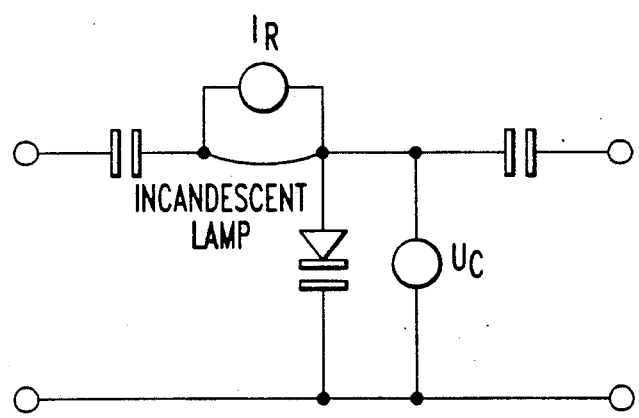
FIG. 7 shows an impedance adjustment circuit.

Another embodiment is particularly suitable for minimizing reflections at the beginning of the measuring conductors. If, for example, a measuring range is needed which extends from dry sand to waterlogged soil, the wave resistance may vary by a factor of 7 such that adjustment of the internal resistance to the measuring conductors is no longer possible. If the echo from the end of the conductor (which may be open or closed) can no longer be distinguished by way of threshold differences, the measured value so obtained is not correct but is actually outside the measurement range. By arranging a controllable impedance adjustment device between the exit of the generators with low internal resistance and the entrance to the measuring conductors, the problem can be solved. The impedance adjustment device can then be adjusted either manually or under the control of a computer until a reasonable measurement value is obtained. Utilizing the entrance impedance of the measuring conductors which is determined from the so-measured time tx (either mathematically or on the basis of an experimentally developed table) the impedance adjustment device is adjusted so as to obtain the best possible adaptation. Then new measurement values are taken to obtain an accurate measurement value. The impedance adjustment device may be a circuit as shown in FIG. 7. The circuit as shown in FIG. 7 includes in one of two parallel lines the heating element of a miniature incandescent lamp whose resistance is controlled by the current source IR connected to the heating element.

A capacitance diode is connected between the two lines and is controlled by a voltage source Uc. The voltage source Uc has a high internal inductive resistance which essentially prevents output of a signal. Two condensers disposed in the line including the incandescent lamp are provided for uncoupling.

Another embodiment is advantageous if the electronic circuit and its surrounding housing at the beginning of the measuring line influence the sample, that is, for example, if those elements cover the soil and the soil therefore is not wetted by the rain. Then connection of the generator and the time measurement device is done by way of cables which are sufficiently long that their wave resistance which they exhibit at the exit of the generator or the entrance of the time measurement circuit depends only very little on the impedance of the measuring line so that the connections at the generator and at the time measurement device may be adapted so as to provide only little reflections.

Figure 8:
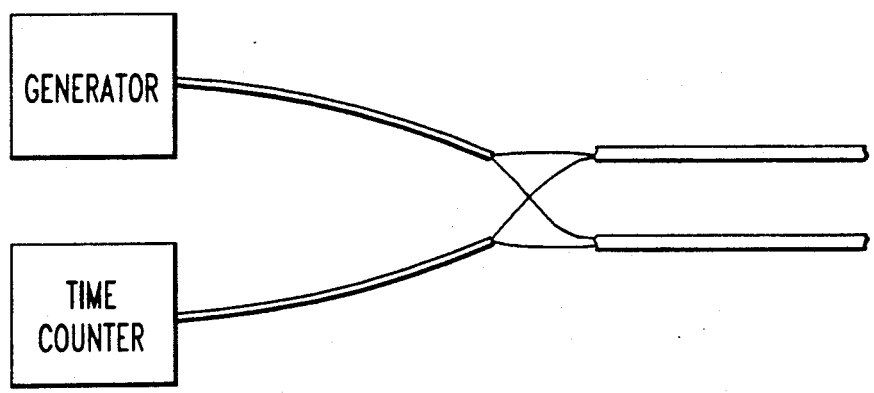
FIG. 8 shows a connection arrangement with few reflections.

In the arrangement as shown in FIG. 8 a signal from the signal generator travels to the time measurement device directly via the measuring conductor connections and also delayed by the echo time tx. The direct signal is utilized to open a gate circuit as in the first example; the signal received by reflection at the end of the measuring conductor is utilized to again close the gate circuit. In this manner determination of tx is achieved like in the first example.

In another embodiment the measurement conductor is surrounded by an insulating layer with a known dielectric constant which is variable depending on the moisture content thereof. In this manner current flow directly through the material can be avoided if such flow is not desirable.

A further embodiment concerns the gate circuit wherein opening of the gate as controlled by the generator occurs only when the reflections at the beginning of the measurement conductor have passed, that is, when the signal has reached the time measuring device and consequently only the reflection signal from the end of the measurement conductor can cause a threshold switch to close the gate circuit.

What is claimed is:

1. In a method for determining the moisture content of a material by measuring the dielectric constant of the material which surrounds, and thereby forms the dielectric of, a measuring conductor utilizing the time lapse between the application of a pulsed electrical signal to the measuring conductor and the return of the echo of the signal from the end of the measuring conductor, the improvement wherein said electrical signal has a pulse duration of a predetermined length greater than the longest time lapse between the start of the electrical signal and return of the echo of the started signal and determining the time lapse by measuring the time delay between application of the electrical signal to the measuring conductor and return of the echo superimposed on said electrical signal as an indication of moisture content of the material.

2. A method according to claim 1, wherein the time between signal start and the return of the echo thereof is divided into a predetermined number of time increments, the desired measurement resolution and accuracy being obtained with a plurality of measurements.

3. A method according to claim 1, wherein for determining the time lapse between the signal start and the return of the echo of the started signal, the oscillations of an independently operating oscillator with a frequency having a cycle duration of less than the expected smallest increment between the signal start and the return of the echo of the started signal are counted, a plurality of such counts is averaged and the average count result is converted to a number value indicative of the moisture content of the material.

4. A method according to claim 3, wherein after a predetermined number of counts the count values are recorded thereby providing partial results and wherein on the basis of a plurality number of partial results the average value of the partial results is determined providing the actual measurement value and also a distribution of the partial result values is determined providing a measure for the reliability of the actual measurement value.

5. A method according to claim 4, wherein said measuring conductor is disposed on a solid sample surface such that the material moisture of the solid sample with essentially flat surface can be measured taking into consideration a situation wherein a dielectric is divided in a plane receiving the measuring conductor, and a non-linear relation between the travel time of the echo and the material moisture content established by a mathematical formula or an experimentally developed table is utilized for representation of the moisture content.

6. An apparatus for determining the moisture content of a material by measuring the dielectric constant of the material in which a measuring conductor is disposed and which forms the dielectric of such a measuring conductor utilizing the time lapse between the application of a pulsed electrical signal to the measuring conductor and the return of the echo of the signal, which electrical signal has a pulse duration greater than the time lapse between signal start and return of the echo thereof, said apparatus including means for determining the time between signal start and the return of the echo thereof, comprising a signal generator connected to said measuring conductor for supplying said electrical signal thereto, a switching device also electrically connected to said measuring conductor for sensing the return of the echo in said measuring conductor

- a counter, connected by way of a gate circuit, to an independently operating oscillator having a frequency whose cycle has a duration which is smaller than the expected smallest increment between the signal start and the echo thereof by only a small multiple and also to said switching device via said gate circuit,
- said gate circuit being held open by said switching device during the time between signal start and return of the echo reflected from the end of the measuring conductor so as to permit passage of count pulses to said counter during the time between signal start and echo return,
- said counter being adapted to sum up the oscillations generated by the oscillator while the gate circuit is open,
- and an evaluation and indication device connected to said counter, said evaluation and indicating device indicating the result of the counting procedure only when at least a predetermined number of gate openings have occurred considered to provide a count result of sufficient resolution,
- and said evaluation and indication device being capable of converting the count result to a number value for the moisture content of the material.

7. An apparatus according to claim 6, wherein said measuring conductor consists of parallel rods.

8. An apparatus according to claim 6, wherein said measuring conductors are provided with insulating covers having a predetermined dielectric constant.

9. An apparatus according to claim 6, wherein one of the measuring conductors is disposed around the other to provide a shield against external fields.

10. An apparatus according to claim 6, wherein one of the measuring conductors is disposed within the other one such that the edges of the outer conductor are also disposed on the surface of a sample so that measuring of the dielectric constant is independent of the area outside the outer conductor.

11. An apparatus according to claim 10, wherein the space between the surrounding conductor and the sample surface is filled with a material of a predetermined dielectric constant.

12. An apparatus according to claim 6, wherein both the signal generator and the measuring circuit are connected to the measuring conductors by cables of a length providing for a wave resistance at one of their ends which is practically independent from the termination at the other ends such that the termination at the generator and the measuring circuit are adaptable even for different wave resistances of the measuring conductors, and wherein the time between application of the energizing signal to the measuring conductor and the return of the echo is measured at the beginning of the measuring conductor by opening the gate circuit when the energizing signal reaches the measuring circuit by way of a cable from the generator to the measuring conductor and the connection between the measuring conductor and the measuring circuit and closing the gate when the echo of the energizing signal reflected at the end of the measuring conductor reaches the time measuring circuit.

13. An apparatus according to claim 6, wherein means are provided for opening said gate circuit only after possible reflections from the beginning of the measuring circuit are past, that is, after arrival of the energizing signal via a direct cable.

14. Apparatus according to claim 12, wherein the generator has an internal resistance which is adjustable to the wave resistance of the measuring conductor which depends on the moisture content of the material in order to reduce interference by reflections at the beginning of the measuring conductor, such adjustability being provided by a circuit having an adjustable impedance and being disposed between the generator and the measuring circuit which both have a low impedance.

15. Apparatus according to claim 14, wherein said circuit for adjusting the impedance is automatically operative,
- wherein said impedance adjusting circuit is adapted to change until a reasonable result is achieved,
- wherein from such result the wave resistance of the measuring conductor is determined and the circuit for adjusting the impedance is adequately adjusted, and
- wherein then new measurements are taken which are utilized for the determination of the material moisture content.

16. Apparatus according to claim 15, wherein the values required for adjustment are taken from a table which also takes the temperature into consideration.

17. Apparatus according to claim 15, wherein a computer is provided with output means for automatically performing the adjustments.

* * * * *